United States Patent
Chien-Chen

(10) Patent No.: US 11,798,876 B2
(45) Date of Patent: Oct. 24, 2023

(54) CHIP ON FILM PACKAGE AND DISPLAY DEVICE INCLUDING THE SAME

(71) Applicant: NOVATEK MICROELECTRONICS CORP., Taiwan (CN)

(72) Inventor: Ko Chien-Chen, Taiwan (CN)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/844,308

(22) Filed: Jun. 20, 2022

(65) Prior Publication Data

US 2023/0076564 A1    Mar. 9, 2023

Related U.S. Application Data

(60) Provisional application No. 63/241,108, filed on Sep. 7, 2021.

(51) Int. Cl.
| | |
|---|---|
| *H01L 23/498* | (2006.01) |
| *H01L 25/065* | (2023.01) |
| *H01L 25/16* | (2023.01) |
| *H01L 23/00* | (2006.01) |

(52) U.S. Cl.
CPC .... *H01L 23/49838* (2013.01); *H01L 25/0655* (2013.01); *H01L 24/16* (2013.01); *H01L 25/162* (2013.01); *H01L 25/167* (2013.01); *H01L 2224/16225* (2013.01)

(58) Field of Classification Search
CPC ........... H01L 23/49838; H01L 25/0655; H01L 25/162; H01L 25/167; H01L 24/16; H01L 2224/16225
See application file for complete search history.

(56) References Cited

U.S. PATENT DOCUMENTS

| | | | | |
|---|---|---|---|---|
| 3,280,019 A | * | 10/1966 | Harding | ............ H01L 21/02164 174/257 |
| 5,426,266 A | * | 6/1995 | Brown | .................... H01L 24/16 174/262 |
| 11,069,586 B2 | * | 7/2021 | Cheng | ................. H01L 23/4985 |

(Continued)

FOREIGN PATENT DOCUMENTS

| | | |
|---|---|---|
| CN | 1348162 A | 5/2002 |
| CN | 102315137 A | 1/2012 |

(Continued)

*Primary Examiner* — Mary Ellen Bowman

(74) *Attorney, Agent, or Firm* — MARSHALL, GERSTEIN & BORUN LLP

(57) ABSTRACT

A Chip on Film (COF) package and a display device including the same are provided. The COF package includes: a film substrate; a chip arranged within a chip region on the film substrate; outer leads; and inner leads. The outer leads are arranged on the same side of the chip region and arranged as at least two rows of outer leads. The inner leads are arranged on a first side and a second side of the chip and connected with the chip. The at least two rows of outer leads include a first row and a second row of outer leads, the first row of outer leads are between the second row of outer leads and the chip, and wirings between at least part of leads among the second row of outer leads and the inner leads on the second side of the chip adopt a closed-loop like connection mode.

22 Claims, 12 Drawing Sheets

(56) References Cited

U.S. PATENT DOCUMENTS

| | | | |
|---|---|---|---|
| 2005/0263885 A1* | 12/2005 | Nakamura | H01L 24/13 257/737 |
| 2006/0131064 A1* | 6/2006 | Hagiwara | H01L 23/4985 174/250 |
| 2015/0311148 A1 | 10/2015 | Jung et al. | |
| 2017/0373024 A1* | 12/2017 | Graf | H01L 23/49838 |
| 2019/0348357 A1* | 11/2019 | Lee | H05K 1/147 |
| 2020/0152553 A1* | 5/2020 | Wu | H01L 24/50 |
| 2020/0286817 A1* | 9/2020 | Choi | H01L 23/49816 |

FOREIGN PATENT DOCUMENTS

| | | |
|---|---|---|
| CN | 106558570 A | 4/2017 |
| CN | 107492525 A | 12/2017 |
| TW | 200836318 A | 9/2008 |
| TW | 200904266 A | 1/2009 |

* cited by examiner

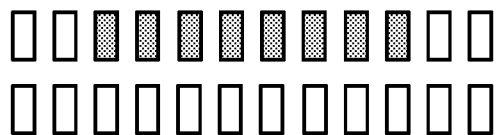
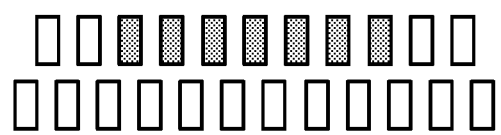
FIG. 6A  FIG. 6B
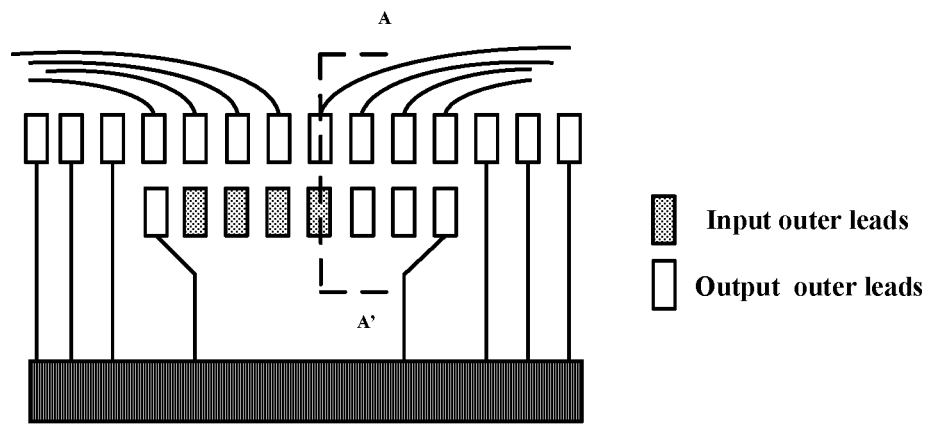
Input outer leads
Output outer leads
FIG. 6C
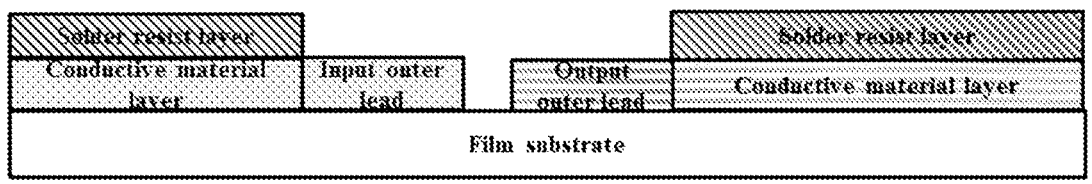
FIG. 7

CHIP ON FILM PACKAGE AND DISPLAY DEVICE INCLUDING THE SAME

CROSS-REFERENCES TO RELATED APPLICATIONS

This application claims the benefit of U.S. Provisional Application No. 63/241,108 filed in the U.S. Patent and Trademark Office on Sep. 7, 2021, the entire disclosure of which is incorporated herein by reference.

TECHNICAL FIELD

The present application relates to the field of display technology, and more particularly, to a Chip on Film (COF) package and a display device including the Chip on Film package.

BACKGROUND

Generally, in a display device, a driving chip can be packaged by utilizing technologies such as Chip on Film (COF) package, Tape Carrier Package (TCP), and Chip on Glass (COG) package. Compared with the Tape Carrier Package (TCP) technology and the Chip on Glass (COG) package technology, Chip on Film packaging (COF) can have fine pitch and good flexibility, making it have good performance in terms of dimensional stability, high circuit density, flame resistance, environmental protection and other needs.

The COF package can be used to bond a printed circuit board (hereinafter also referred to as a control circuit board) on which a display control circuit is disposed with the substrate of a display panel (e.g., an LCD display panel or an OLED display panel), or to bond a printed circuit board on which a backlight control circuit (hereinafter also referred to as a control circuit board) is disposed with the substrate of a backlight board (e.g., a backlight board used for an LCD display panel). Of course, COF package can be used to bond other similar circuit boards.

As requirement for size and thickness of the display device and requirement for production efficiency are getting higher and higher, since the COF package is typically arranged on the edge or back of the display panel or the backlight board, higher requirement is also raised as to size and thickness of the COF package; in addition, if the COF package can quickly realize the bonding between the circuit boards, it will be beneficial to improve production efficiency of the display device.

SUMMARY

According to a first aspect of the present application, there is provided a Chip on Film package, comprising: a film substrate; a chip arranged within a chip region on the film substrate; outer leads arranged on a same side of the chip region on the film substrate, the outer leads being arranged as at least two rows of outer leads and including input outer leads and output outer leads; inner leads arranged on a first side and a second side of the chip and connected with the chip, the first side of the chip being a side facing the outer leads, and the inner leads including input inner leads and output inner leads; wherein the output inner leads are connected with the output outer leads, for providing signals outputted by the chip to the output outer leads; and the input inner leads are connected with the input outer leads, for providing signals from the input outer leads to the chip, wherein the at least two rows of outer leads include a first row of outer leads and a second row of outer leads, the first row of outer leads are between the second row of outer leads and the chip, and wirings between at least a part of leads among the second row of outer leads and the inner leads on the second side of the chip adopt a closed-loop like connection mode.

According to a second aspect of the present application, there is provided a display device, comprising: the Chip on Film package according to the first aspect of the present application; the display panel used to display contents to be displayed; a backlight board on which a backlight circuit is arranged, for providing backlight for the display panel; a control circuit board on which a control circuit is arranged, providing backlight control signals to the chip in the thin Chip on Film package and/or obtain backlight related signals from the chip, wherein input outer leads in the Chip on Film package obtain the backlight control signals from the control circuit, and output outer leads provide backlight driving signals to the backlight circuit and/or provide backlight related signals to the control circuit, the backlight driving signals are generated by the chip based on the backlight control signals.

According to a third aspect of the present application, there is provided a display device, comprising: the Chip on Film package according to the first aspect of the present application; a display panel on which a display circuit is arranged; a control circuit board on which a control circuit is arranged, for providing display control signals to the display circuit, and for providing display driving control signals to a chip in the Chip on Film package or to obtain driving related signals from the chip, wherein input outer leads in the Chip on Film package obtain the driving control signals from the control circuit, and output outer leads provide the display driving signals to the display circuit or provide the driving related signal to the control circuit, the display driving signals are generated by the chip based on the display driving control signals.

With reference to structure of the COF package described in the present application, it can use a single layer of conductive material to form two rows of input outer leads and output outer leads or it can use two layers of conductive material to form three or four rows of input outer leads and output outer leads, as well as the wirings through which outer leads are connected with inner leads. Thus the number of output signals from the COF package can be increased, so that a smaller number of COF packages can be adopted and thickness of the COF package can be reduced, thereby cost can be reduced and size requirement can be met; further, wiring space can be fully utilized by setting part of the wirings in a closed-loop like mode, so that the spacing between the wirings or the spacing between the leads is not too small, and stability of signal transmission is improved; in addition, only one bonding process is required when the COF package is bonded with the backlight board or the display panel in the display device and control circuit board, production efficiency can be improved accordingly.

BRIEF DESCRIPTION OF THE DRAWINGS

The accompanying drawings are used to provide a further understanding of the embodiments of the present disclosure, and constitute a part of the specification to be used to explain the present disclosure together with the embodiments of the present disclosure, without constituting a limitation to the present disclosure. In the drawings, the same reference signs generally represent the same/similar components or steps.

FIGS. 6A-6C show exemplary arrangements of outer leads.

FIG. 7 shows a schematic cross-sectional view taken along the connection line A-A' of FIG. 6C when the outer leads are arranged as in FIG. 6C.

DETAILED DESCRIPTION OF THE EMBODIMENTS

In order to make the objectives, technical solutions and advantages of the present application more apparent, the exemplary embodiments according to the present application will be described in detail below with reference to the drawings. Obviously, the described embodiments are only part of the embodiments of the present application, rather than all the embodiments of the present application, and it should be understood that the present application is not limited by the example embodiments described herein.

In this specification and the drawings, steps and elements that are substantially the same or similar are denoted by the same or similar reference numbers, and repeated descriptions of these steps and elements will be omitted. Meanwhile, in the description of the present application, the terms "first", "second" and the like are only used to distinguish the description, and cannot be understood as indicating or implying relative importance or order. Unless explicitly stated, the singular expression can refer to the plural, and the plural expression can also refer to the singular.

Figure 1A:
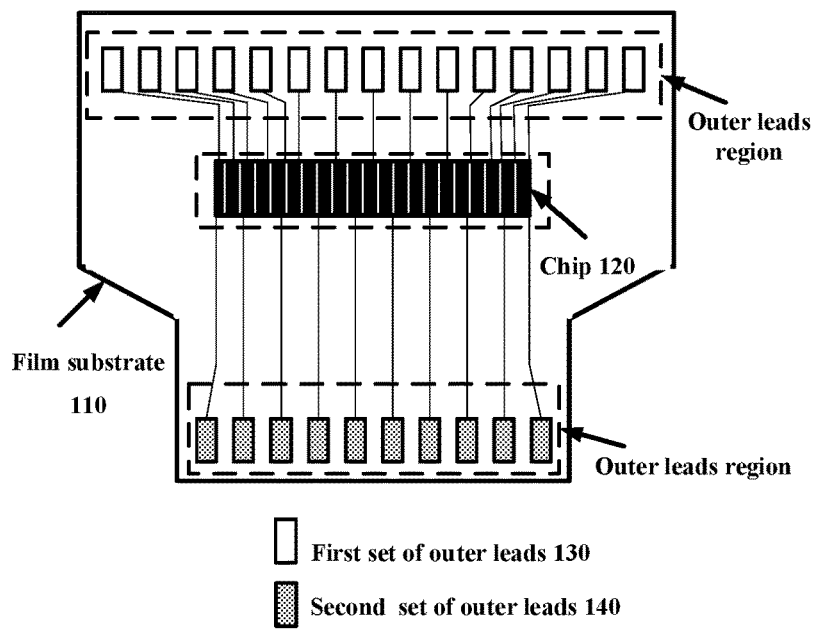
FIG. 1A shows a schematic planar view of a COF package.

FIG. 1A shows a schematic planar view of a COF package.

As shown in FIG. 1A, the COF package 100 includes thereon a film substrate 110, a chip 120, a first set of outer leads 130 and a second set of outer leads 140 respectively arranged on two sides of the chip. A lead or lead bonding in the present disclosure may also refer to a conductive design for bonding with external devices. The outer leads of the COF package are the leads on two sides of the COF package. For the convenience of description, only a small number of leads are schematically shown in the drawings of the present application, but those skilled in the art should understand that the number of leads can be set according to actual needs.

The chip 120 is arranged in a chip region on the film substrate 110, and the film substrate 110 includes inner leads (not shown) including the inner leads arranged on a first side of the chip (the upper side in FIG. 1A) and the inner leads arranged on a second side of the chip (lower side in FIG. 1A). The inner leads can be correspondingly bonded with the conductive bumps (input bumps and output bumps) of the chip for signal transmission. Optionally, the chip 120 may be a display driving chip (driving IC), which is used to receive display driving control signals, and output display driving signals after processing, or the chip 120 may be a backlight driving chip, which is used to receive backlight control signals, and output backlight driving signals after processing.

The first set of outer leads 130 and the second set of outer leads 140 are leads that can be bonded with an external circuit board, and correspond to the inner leads on the first side of the chip and the inner leads on the second side of the chip, respectively. Depending on the signal transmission direction, one of the first set of outer leads 130 and the second set of outer leads 140 may be input leads and the other thereof may be output leads.

FIG. 1A shows that the second set of outer leads 140 are input leads and the first set of outer leads 130 are output leads, in this way, the input inner leads on the second side of the chip are used to provide the signals from the second set of outer leads 140 to the chip, and the output inner leads on the first side of the chip are used to provide the signals outputted by the chip to the first set of outer leads 130.

In FIG. 1A, the first set of outer leads and the second set of outer leads each are arranged in one row, and the wirings between the outer leads and the inner leads are all straight-pull, and these wirings are formed by a single layer of conductor (e.g., copper).

Figure 1B:
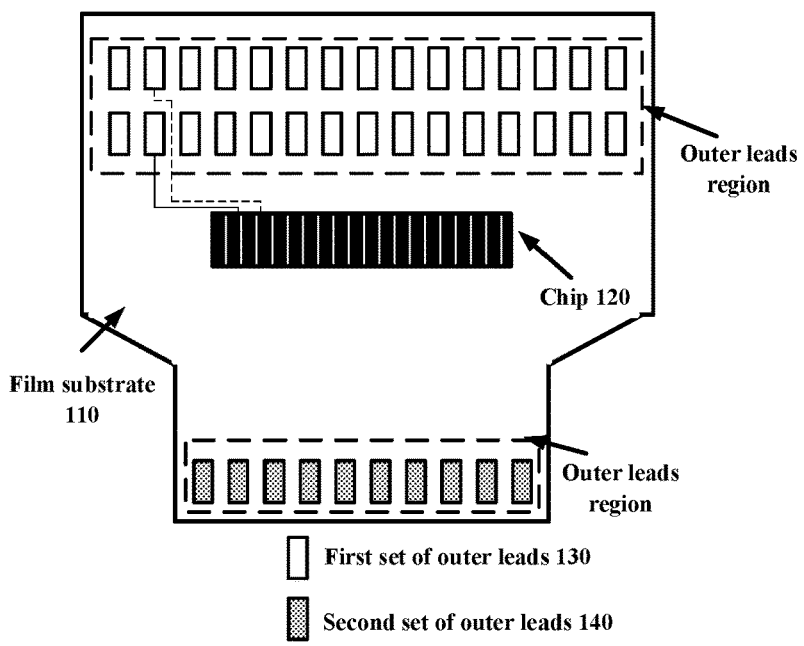
FIG. 1B shows a schematic planar view of a COF package.

In some other embodiments, the first set of outer leads and the second set of outer leads each may be arranged in two rows so as to provide more signal paths. As shown in FIG. 1B, a COF package in which the first set of outer leads is arranged in two rows is shown. Of course, the second set of outer leads may also be arranged in two rows. In this way, smaller wiring spacing is required to realize the connection between the outer leads and the inner leads. Considering the large number of outer leads, the wiring spacing should be reduced as much as possible, but the wiring spacing cannot be too small. If it is necessary to ensure proper wiring spacing, two layers of conductor (conductive material layers) arranged on two opposite surfaces (upper and lower surfaces) of the film substrate are required to form the wirings between each row of outer leads and corresponding inner leads.

Figure 1C:
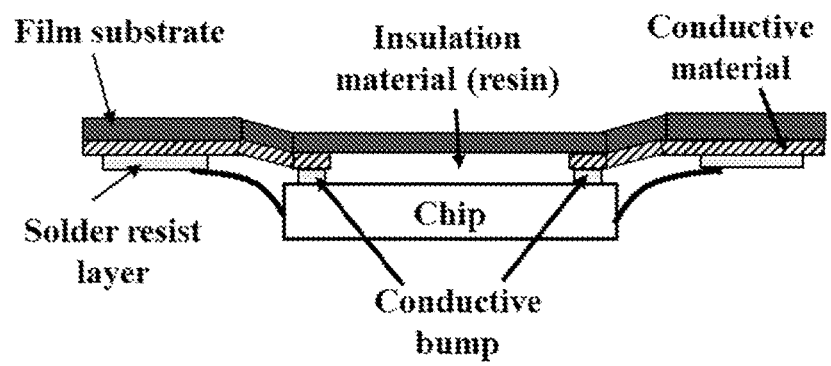
FIG. 1C shows a schematic cross-sectional view of the COF package of FIG. 1A (a single layer of conductor is adopted).
Figure 1D:
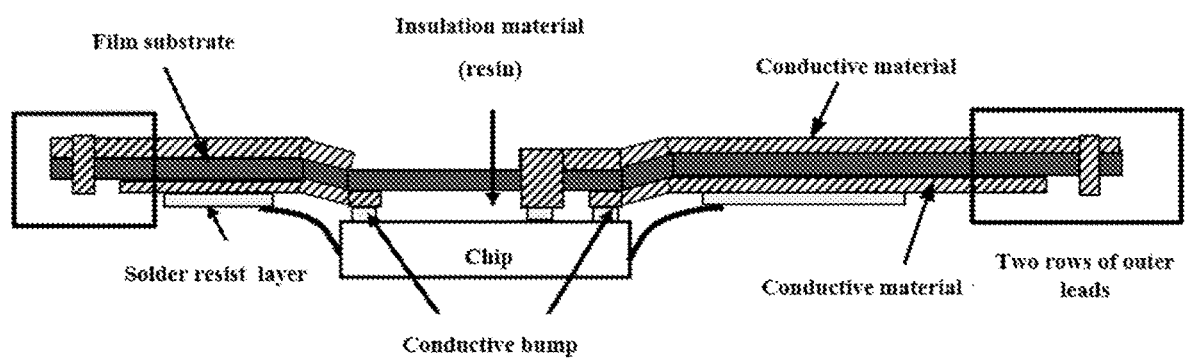
FIG. 1D shows a schematic cross-sectional view of the COF package in FIG. 1B (two layers of conductor are adopted).

FIG. 1C shows a schematic cross-sectional view of the COF package of FIG. 1A (a single layer of conductor is adopted), and FIG. 1D shows a schematic cross-sectional view of the COF package in FIG. 1B (two layers of conductor are adopted).

In FIG. 1C, respective outer leads of the first set of outer leads and the second set of outer leads arranged in a single row and the wirings between them and the inner leads are formed by a single layer of conductive material (copper).

In FIG. 1D, the first set of outer leads arranged in two rows and the second set of outer leads arranged in two rows are arranged in the region not covered by the solder resist layer, and the two conductive material layers are arranged on two opposite surfaces of the film substrate and are used to form wirings between all outer leads and corresponding inner leads. Although it is shown in FIG. 1D that the two sets of outer leads are both arranged in two rows, it is also feasible that one of the two sets of outer leads (e.g., input outer leads) are arranged in a single row.

Figure 2:
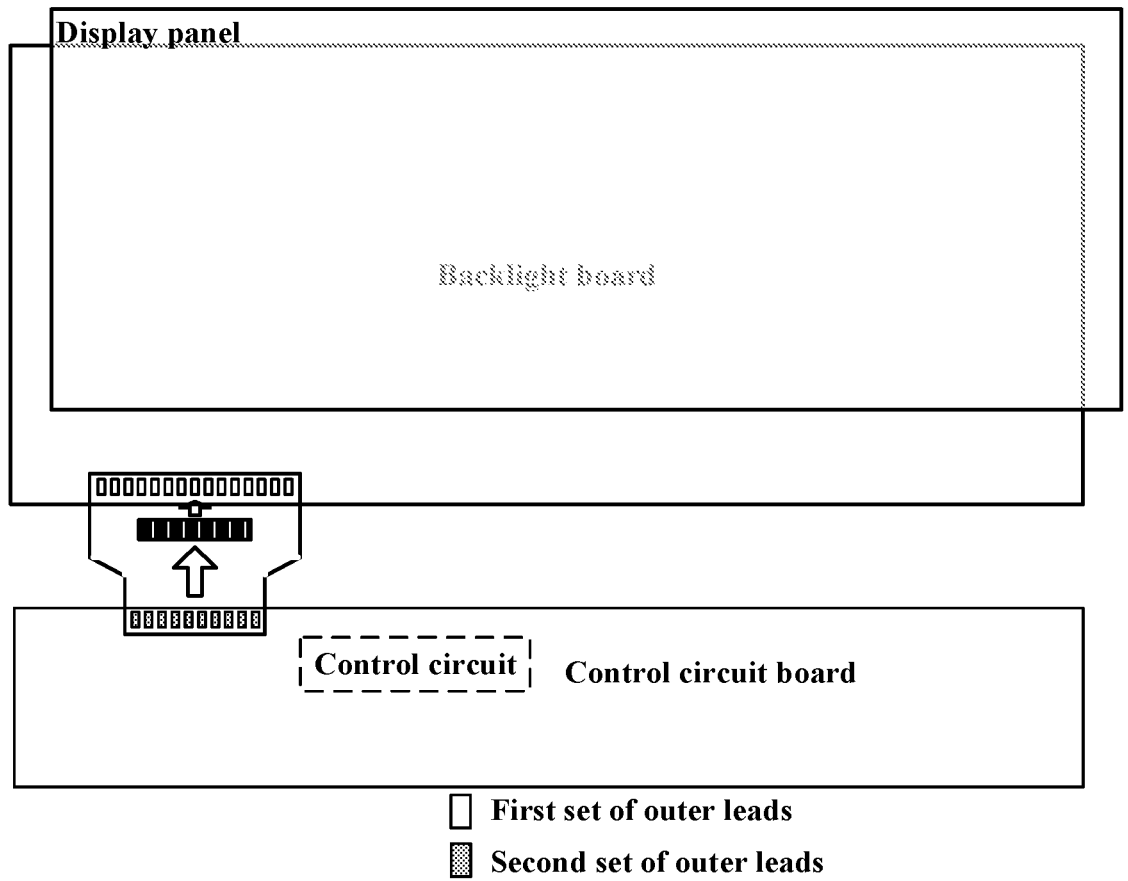
FIG. 2 shows a schematic structure in which the COF package described with reference to FIGS. 1A-1D is applied to a display device.

FIG. 2 shows a schematic structure in which the COF package described with reference to FIGS. 1A-1D is applied to a display device.

In FIG. 2, the COF package being used to bond with a backlight board (herein, actually bonded with the substrate of the backlight board) is taken as an example, but it should be understood that the COF package can also be used to bond with an LED display panel or an LCD display panel (herein, actually bonded with the substrate of the display panel) or other circuit board, etc.

As shown in FIG. 2, the COF package is bonded with a bonding region at the edge of the backlight board through the first set of outer leads, and is bonded with a bonding region of the control circuit board through the second set of outer leads. Only one COF package is schematically shown in FIG. 2, but it should be understood that there may be multiple COF packages bonded with the bonding regions at the edge of the backlight board according to the number of signals required to be provided to the backlight board in practical applications.

In FIG. 2, the control circuit on the control circuit board provides backlight control signals to the inner leads on the second side of the chip (e.g., driving chip) through the wirings between the second set of outer leads bonded to the control circuit board and the inner leads on the second side of the driving chip. The backlight driving signals are generated after the backlight control signals are processed by the chip, the backlight driving signals are provided to the backlight board via the wirings between the inner leads at the first side of the chip and the first set of outer leads, and via the bonded first set of outer leads, so as to drive the backlight board to emit light.

For the example COF package described with reference to FIGS. 1A-1D, and the example display device including the COF package described with reference to FIG. 2, in many cases, the number of output outer leads is often large, and it may be desirable to arrange the output outer leads used to output signals (such as the first set of outer leads shown in FIG. 2) in two rows. In this case, in order to ensure that the wiring spacing is not too narrow to cause a short circuit or introduce noise, it is necessary to adopt the structure shown based on two conductor material layers as shown in FIG. 1D, thus thickness of the COF will increase, and higher manufacturing cost is required; in addition, when the COF package is applied to the display device, since the COF package needs to be bonded to the bonding region of for example the backlight board and the bonding region of the control circuit board respectively, thus two bonding (also called pressing, compression, etc.) processes are required, which makes the production process cumbersome and limits the production efficiency.

Figure 3:
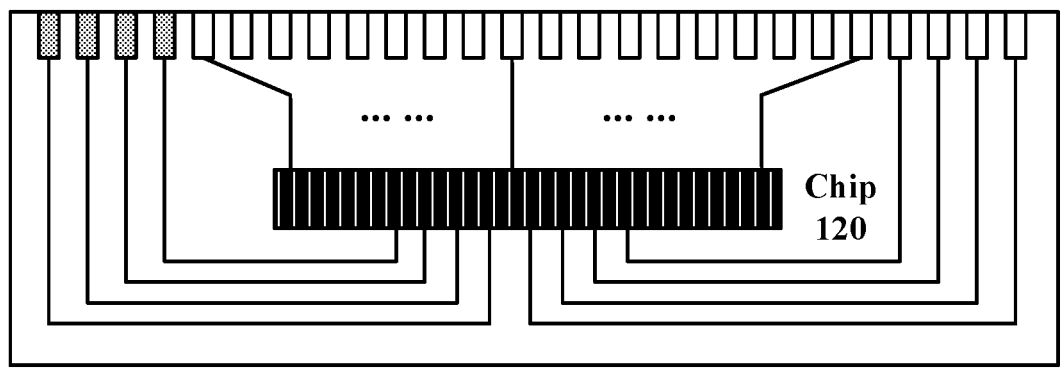
FIG. 3 is a schematic planar view of an improved COF package.

In FIG. 3, the COF package of another structure is provided.

In FIG. 3, similar components or features may have the same reference signs as in FIG. 1A, e.g., the chip 120, the first set of outer leads 130, the second set of outer leads 140, and so on. The differences between the COF package of FIG. 3 and the COF package of FIGS. 1A-1D will be introduced below.

As shown in FIG. 3, the first set of outer leads 130 and the second set of outer leads 140 both are located on the same side of the chip region, the first set of outer leads 130 are used as output outer leads, and the second set of outer leads 140 are used as input outer leads.

Likewise, the input inner leads (not shown) connected with the conductive bumps of the chip 120 are connected with the second set of outer leads 140 by wirings, for inputting signals to be processed (e.g., the backlight control signals or the display driving control signals) to the chip via the second set of outer leads 140; the output inner leads (not shown) connected with the conductive bumps of the chip 120 are connected with the first set of outer leads 130 by wirings, for providing signals processed by the chip (e.g., the display driving signals and the backlight driving signals) from the first set of outer leads 130.

Optionally, when the COF package shown in FIG. 3 is used to bond with the backlight board and the control circuit board, since the input outer leads and the output outer leads are located on the same side of the chip region, thus only one circuit board can be bonded with the COF package. In this case, the backlight control signals that need to be transmitted by the control circuit on the control circuit board to the chip on the COF package may be first transmitted to the backlight board, and then transmitted to corresponding bonding pads in the bonding region on the backlight board through the wirings arranged on the backlight board. In this way, when the COF package is bonded with the bonding region of the backlight board, the backlight control signals to be provided to the chip can be obtained at the input outer leads of the COF package as the input signals of the COF package. The backlight control signals, after being processed by the chip, backlight driving signals are provided from the output outer leads to the backlight circuit on the backlight board through corresponding bonding pads in the bonding region of the backlight board.

That is to say, when bonding the COF package shown in FIG. 3 with the backlight board (or the display panel) and the control circuit board, bonding process is required to be performed only once (the COF package is no longer necessary to bond with the control circuit board, because the control signals have been transmitted to corresponding bonding pads in the bonding region of the backlight board), and a single layer of conductive material can be used to form the wirings connecting the input outer leads and the output outer leads with their corresponding inner leads, so that thickness of the COF package can be reduced, cost can be reduced and production efficiency can be increased.

For the COF package described with reference to FIG. 3, since the input outer leads and the output outer leads are both arranged at the edge of the film substrate and they are arranged in one row, thus when the COF package is arranged at the edge of the display panel or the backlight board, and the edge of the display panel or the backlight board is small in size, it is necessary to shorten the spacing between the input outer leads and the output outer leads as well as the spacing between wirings connecting outer leads and corresponding inner leads. This may cause the wiring spacing between wirings or the spacing between leads to be too small, resulting in possible interference between signals, or even short circuits.

Thus, according to the first aspect of the present disclosure, an improved structure of COF package is provided, which can form, by using a single layer of conductive material or two layers of conductive material, a higher number of outer leads as well as a higher number of wirings connecting outer leads with corresponding inner leads, so that the thickness of the COF package can be reduced, the number of COF packages can be reduced, the cost can be reduced and the production efficiency can be improved; in addition, by setting part of wirings in a closed-loop, the wiring space can be fully utilized, so that the spacing between the wirings or the spacing between the leads are not too small, and the stability of signal transmission is improved.

The term "closed-loop" mentioned in the present application may also be referred to as cyclic, or loop, and closed-loop like wirings or closed-loop like connections or similar expression represent the wirings between the inner leads from the second side of the chip (the first side of the chip is the side of the chip facing the outer lead region) and the outer leads surround the chip region and part of the outer lead regions, and have a curved shape.

The term "straight-pull wirings or straight-pull connections or similar expression" mentioned in the present application refers to the wirings between the inner leads from the first side of the chip (the first side and the second side are defined according to the COF package in FIG. 1A) and the outer leads are included between the chip region and the outer lead region, and is composed of straight lines.

Figure 4A:
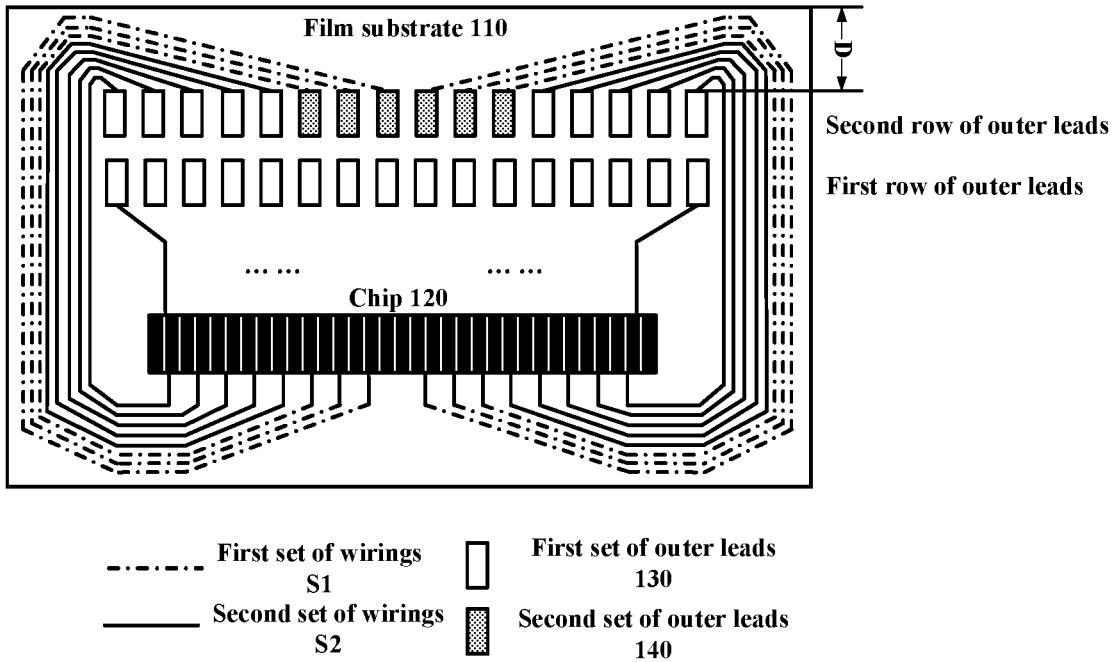
FIGS. 4A-4B show schematic planar structure views of the improved COF package according to an embodiment of the present application.
Figure 4B:
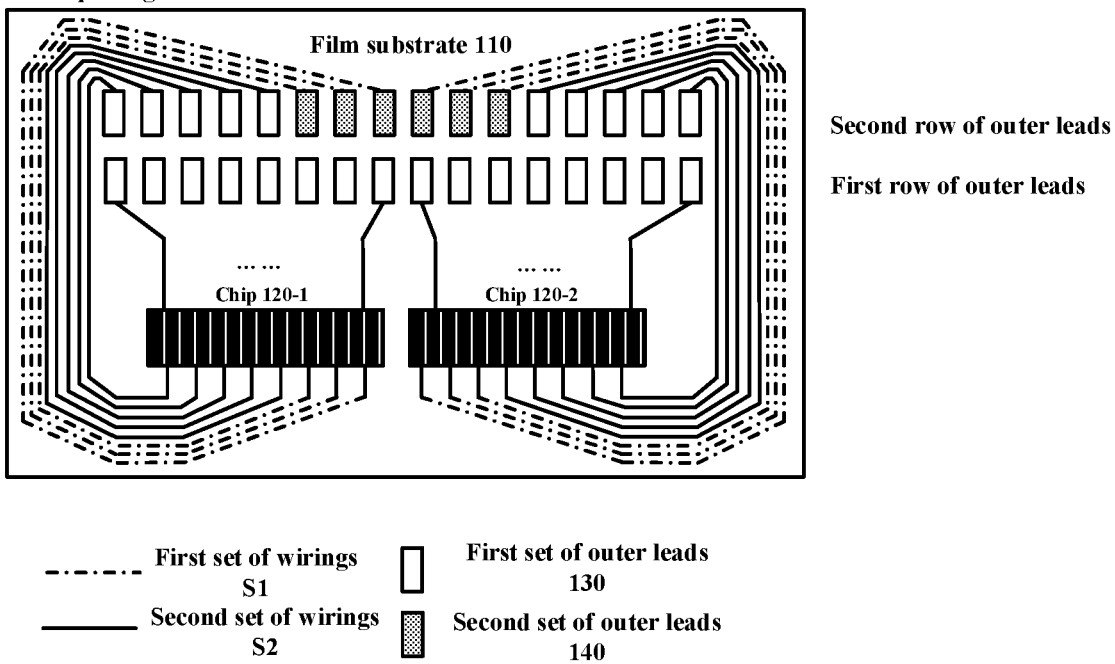

FIGS. 4A-4B show schematic planar structure views of the improved COF package according to an embodiment of the present application.

As shown in FIGS. 4A-4B, the COF package 400 includes thereon a film substrate 110, a chip 120, outer leads (including a first set of outer leads 130 and a second set of outer leads 140), and inner leads located on two sides of the chip 120.

The chip 120 is arranged in the chip region on the film substrate. Only one chip is shown in FIG. 4A, but the chip 120 may include multiple chips in a chipset in many instances. As shown in FIG. 4B, the chip 120 includes a chip 120-1 and a chip 120-2, and each chip obtains input signals, processes the signals, and then outputs the processed signals.

The outer leads are arranged on the same side of the chip region on the film substrate 110, and the outer leads are arranged as at least two rows of outer leads and include input outer leads and output outer leads.

The inner leads are arranged on the first side and the second side of the chip 120, and are connected with the chip 120 (e.g., conductive bumps of the chip). The first side of the chip is the side facing the outer leads, and the inner leads include the input inner leads and the output inner leads.

The output inner leads are connected to the output outer leads (the first set of outer leads 130), for providing the signals outputted by the chip 120 to the output outer leads; and the input inner leads are connected to the input outer leads (the second set of outer leads 140), for providing the signals from the input outer leads to the chip 120.

It should be understood that the first set of outer leads 130 in FIG. 4A may also be input outer leads, and the second set of outer leads 140 may also be output outer leads according to the quantity relationship of input signals and output signals of the chip and the direction of signal transmission.

The outer leads of the COF package shown in FIGS. 4A-4B include a first row of outer leads and a second row of outer leads, wherein the first row of outer leads are interposed between the second row of outer leads and the chip 120, and the wirings between at least part of the second row of outer leads and the inner leads on the second side of the chip adopt a closed-loop like connection mode. For example, the wirings between the inner leads on the first side of the chip 120 and the first row of outer leads adopt a straight-pull connection mode; and the wirings between the inner leads on the second side of the chip 120 and the second row of outer leads adopt a closed-loop like connection mode.

The region on the film substrate 110 where the outer leads are arranged is called the outer lead region, wherein the outer lead region is at a predetermined distance (shown as "D" in FIG. 4A) from the edge of the film substrate, and the region defined by the predetermined distance is used to arrange the wirings when adopting the closed-loop like connection mode, for example, the predetermined distance may be 100 um. As shown in FIGS. 4A-4B, the region between the edge of the film substrate 110 and the second row of outer leads may provide a space for arranging the closed-loop like wirings.

Figure 4C:
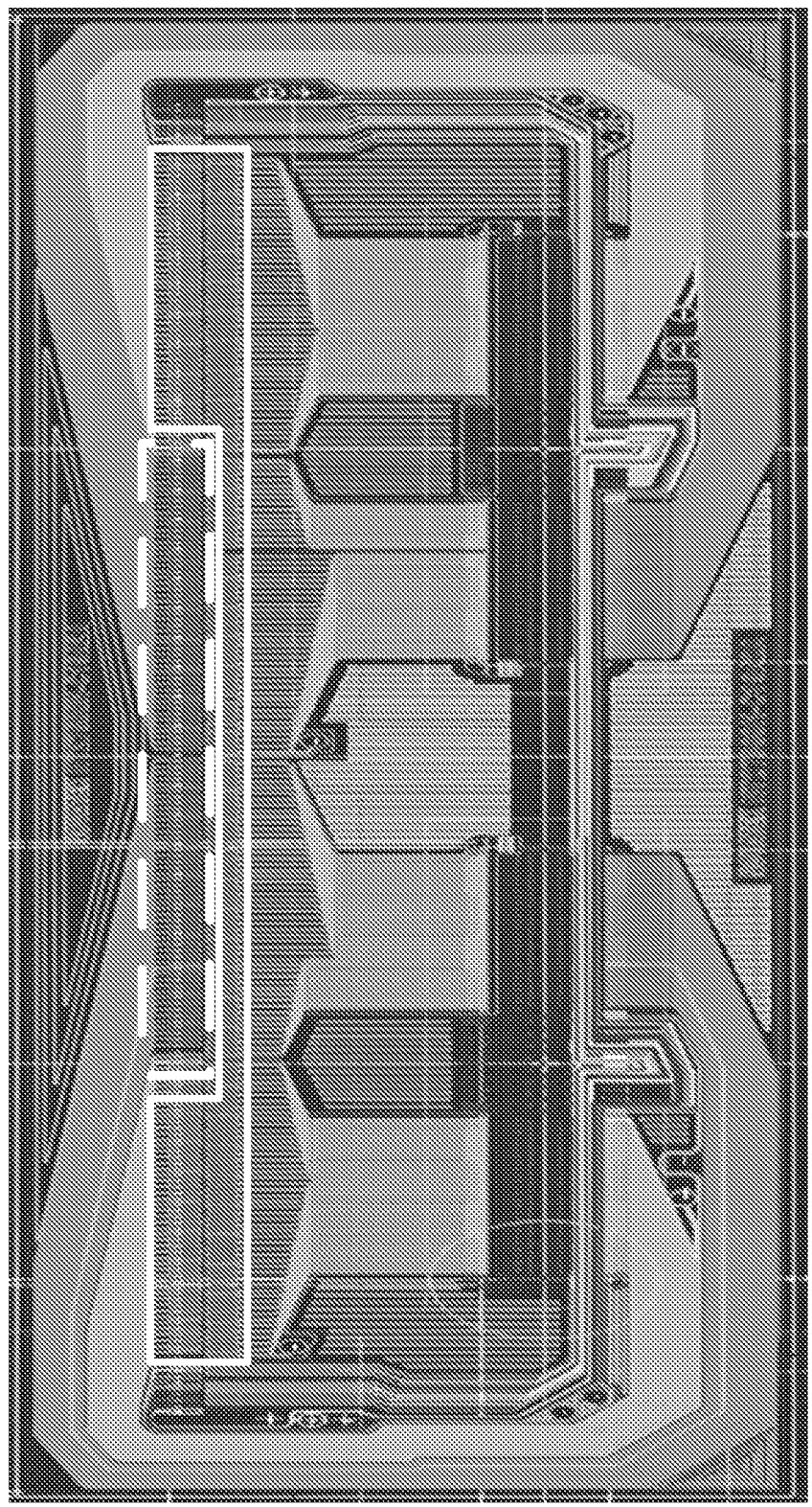
FIG. 4C shows an example of an actual layout of the improved COF package according to an embodiment of the present application.

FIG. 4C shows an example of an actual layout of an improved COF package according to an embodiment of the present application.

As shown in FIG. 4C, there are two rows of outer leads arranged in the outer lead region, wherein the outer leads corresponding to the white dotted frame region and the outer leads corresponding to the white solid frame region can be used as input outer leads and output outer leads, respectively.

In FIGS. 4A-4C, the description has been given with that the outer leads include outer leads arranged in two rows, and the first set of outer leads 130 and the second set of outer leads 140 as included serve as output outer leads and input outer leads respectively as an example, but those skilled in the art should understand that different configurations of input outer leads and output outer leads can be performed according to the actual signal transmission.

Optionally, each row of outer leads among the outer leads may include different types of outer leads, for example, including both input outer leads and output outer leads, or may also include only one type of outer leads. The types of respective outer leads in each row can be determined correspondingly according to the specific arrangement mode of the input conductive bumps and the output conductive bumps of the chip. For example, as shown in FIG. 4C, the inner leads on the second side of the chip include both input inner leads and output inner leads, and the inner leads on the first side of the chip include output inner leads, thus, the first row of outer leads connected to the output inner leads on the first side of the chip via the wirings of a straight-pull connection mode are correspondingly output outer leads, the second row of outer leads connected to the output inner leads on the second side of the chip via the wirings of a closed-loop like connection mode are correspondingly the output outer leads, and the second row of outer leads connected to the input inner leads on the second side of the chip via the wirings of a closed-loop like connection mode are correspondingly the input outer leads.

Figure 5A:
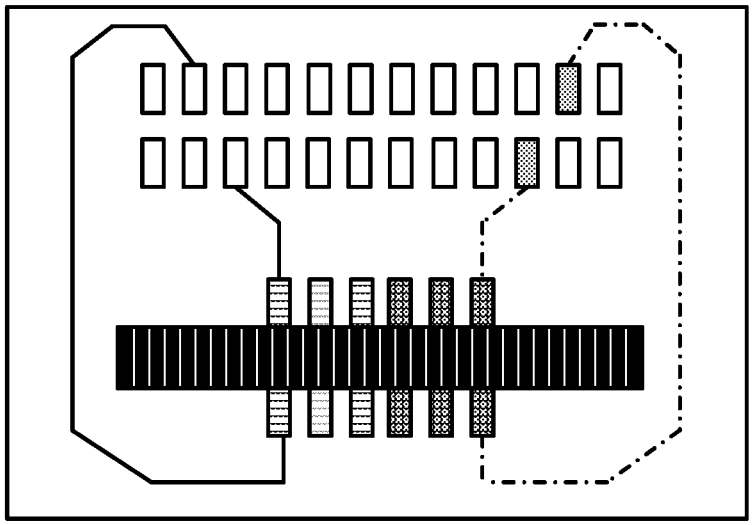
FIGS. 5A-5B show schematic simplified planar structure views of COF packages according to different types of outer leads and inner leads.

For example, in an example situation, the output inner leads may be arranged on two sides of the chip, and/or, the input inner leads may also be arranged on two sides of the chip. For the convenience of description, FIG. 5A only shows the wirings between a few outer leads and corresponding inner leads. As shown in FIG. 5A, the wirings between the output inner leads arranged on the first side of the chip among the output inner leads and their corresponding output outer leads adopt a straight-pull connection mode, and the wirings between the output inner leads arranged on the second side of the chip and their corresponding output outer leads adopt a closed-loop like connection mode; and/or, the wirings between the input inner leads arranged on the first side of the chip among the input inner leads and their corresponding input outer leads adopt a straight-pull connection mode, and the wirings between the input inner leads arranged on the second side of the chip and their corresponding input outer leads adopt a closed-loop like connection mode.

Figure 5B:
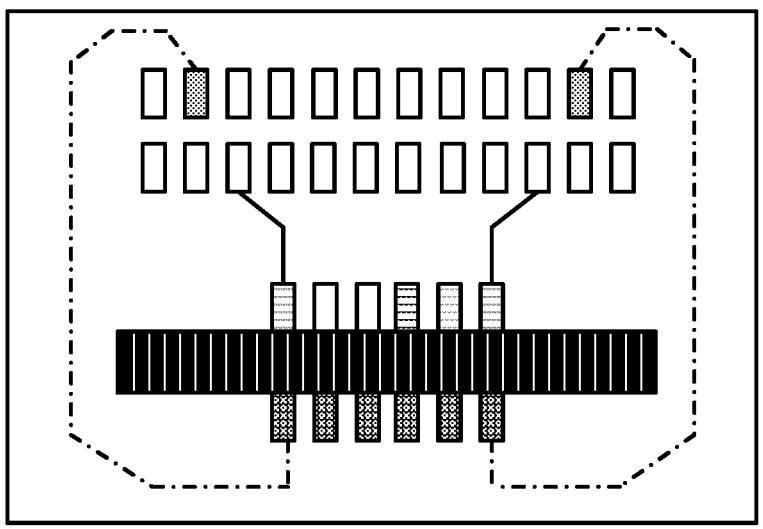

In one example situation, the output inner leads are all arranged on the first side of the chip or all arranged on the second side of the chip, and/or, the input inner leads are all arranged on the first side of the chip or all arranged on the second side of the chip. As shown in FIG. 5B, in the case where the output inner leads are all arranged on the first side of the chip, the wirings between the output inner leads and their corresponding output outer leads adopt a straight-pull connection mode, and/or, in the case where the input inner leads are all arranged on the second side of the chip, the wirings between the input inner leads and their corresponding input outer leads adopt a closed-loop like connection mode; similarly, in the case where all the output inner leads are arranged on the second side of the chip, the wirings between the output inner leads and their corresponding output outer leads adopt a closed-loop like connection mode, and/or, in the case where the input inner leads are all arranged on the first side of the chip, the wirings between the input inner leads and their corresponding input outer leads adopt a straight-pull connection mode.

In addition, the two rows of outer leads in the COF package may be aligned or alternate. The number of outer leads in each row may be unequal, and the spacing between adjacent outer leads may also be unequal.

FIGS. 6A-6C illustrate several exemplary arrangement modes of outer leads.

For example, in FIG. 6A, as well as in the foregoing FIGS. 4A-4C and 5A-5B, the alignment arrangement mode of two rows of outer leads is shown. Of course, the outer leads can also adopt an alternate arrangement mode, as shown in FIG. 6B.

In addition, in the case where the number of outer leads in each row is not equal, as shown in FIG. 6C, the number of the second row of outer leads may be more than the number of the first row of outer leads. In this case, the wirings between a part of the outer leads among the second row of outer leads and the inner leads on the second side of the chip may adopt a closed-loop like connection mode (the closed-loop wirings are schematically shown in curve lines in FIG. 6C), and the wirings between the other part of the outer leads among the second row of outer leads and the inner leads on the first side of the chip adopt a straight-pull connection mode.

The above description takes two rows of outer leads as an example, but it should be understood that for three or four rows of outer leads, the arrangement mode of outer leads, the wiring arrangement mode between leads, and the determination mode of the types of outer leads are all similar, except that one additional layer of conductor (layer of conductive material) needs to be added to form one or two additional sets of wirings, as will be described later with reference to FIGS. 8A-8B.

For example, if the outer leads are arranged in only two rows, only a single layer of conductive material is required to form all the wirings between the input outer leads and the input inner leads and between the output inner leads and the output outer leads. For example, in FIGS. 4A-4C, the first and second sets of wirings S1 and S2 may be formed by only a single layer of conductive material. The first and second sets of outer leads 130 and 140 can also be formed by the single layer of conductive material.

FIG. 7 shows a schematic cross-sectional view taken along the connection line A-A' of FIG. 6C when the outer leads are arranged in two rows.

As shown in FIG. 7, the outer leads (including the input and output outer leads) and wirings are formed in a layer of conductive material on the film substrate and the part of the layer forming the wirings is covered with a solder resist layer. The input outer leads can be electrically connected with the wirings of a closed-loop like connection mode, and the output outer leads can be electrically connected with the wirings of a straight-pull connection mode. The conductive material can be copper. There is an interval in the shown horizon direction between the shown input outer lead and output outer lead. Of course, according to the setting of the types of the inner leads on two sides of the chip, the types of the input outer leads and the output outer leads in FIG. 7 can be adjusted.

Figure 8A:
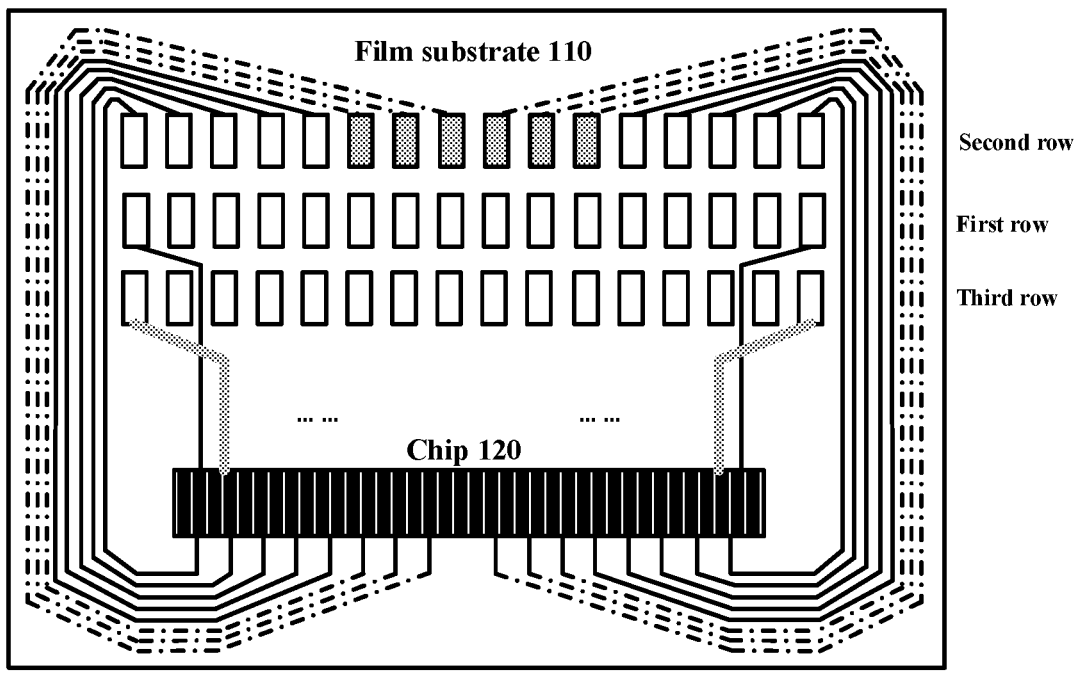
FIGS. 8A-8B illustrate a schematic simplified planar structure view of a COF package when the outer leads are arranged in three or four rows according to an embodiment of the present application.
Figure 8B:
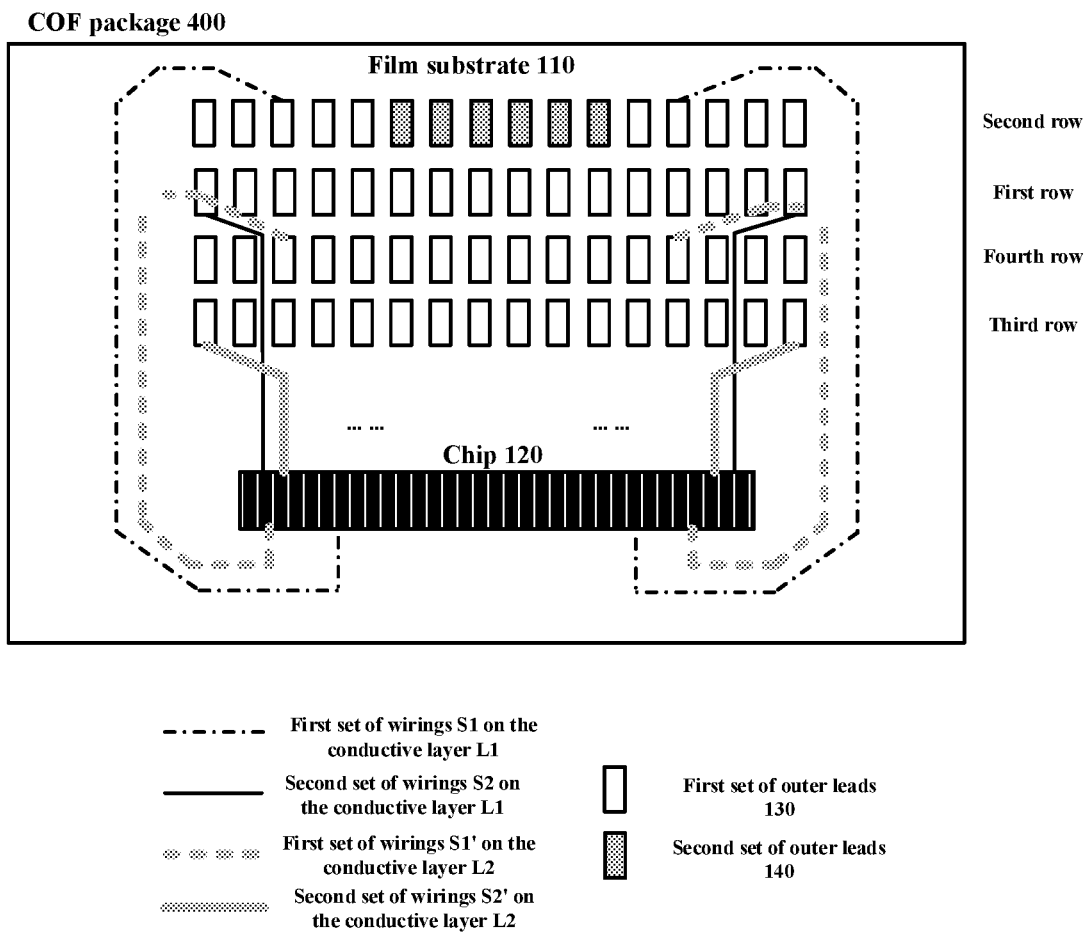

In addition, if the outer leads are arranged in three or four rows, two layers of conductive material isolated from each other on two opposite surfaces of the film substrate may be used to form all the wirings between the input outer leads and the input inner leads and between the output inner leads and the output outer leads, the specific structure is shown in FIG. 8A-8B.

FIGS. 8A-8B illustrate simplified planar structure views of a COF package when the outer leads are arranged in three or four rows according to an embodiment of the present application.

As shown in FIG. 8A, if the outer leads are arranged in three rows, the first to the third rows of outer leads as well as all wirings between the first and the second rows of outer leads and corresponding inner leads can be formed by the first layer of conductive material (conductive layer L1) on the first surface of the film substrate (the surface where the chip is located), and all wirings between the third row of outer leads and corresponding inner leads can be formed by the second layer of conductive material (conductive layer L2) on the second surface of the film substrate (the surface opposite to the surface where the chip is located). As mentioned earlier, the type (input type or output type) of each outer lead and each inner lead is designed according to the actual situation.

In FIG. 8A, in combination with the arrangement of the two layers of conductive material shown in FIG. 1D above, the connections between a part of the outer leads and corresponding inner leads are realized through the wirings that pass through the film substrate 110 and are formed on the layers of conductive material.

The design of the wirings on the conductive layer L1 is the same as that described above with reference to FIGS. 4A-4C, and the conductive layer L2 is used to form the wirings between the third row of outer leads and corresponding inner leads. In FIG. 8A, the wirings between the third row of outer leads and the inner leads on the first side of the chip adopting a straight-pull connection mode is taken as an example (the wirings will pass through the film substrate twice), but it should be understood that according to the specific design of the type of the inner leads, the third row of outer leads may be connected with the inner leads on the second side of the chip, and the wirings between the third row of outer leads and the inner leads on the second side of the chip may adopt a closed-loop like connection mode (the wirings will pass through the film substrate twice).

In addition, in FIG. 8A, the third row of outer leads is arranged next to the first row of outer leads, but it should be understood that the third row of outer leads may be arranged between the first and second rows of outer leads, because the related wirings of the third row of outer leads are formed on another layer of conductive material, and pass through the film substrate 110 only in the regions of the third row of outer leads and corresponding inner leads, to connect with the third row of outer leads, so the related wirings of the first and second row of outer leads will not be affected.

Similarly, as shown in FIG. 8B, if the outer leads are arranged in four rows, the first to the fourth rows of outer leads as well as all wirings between the first and the second rows of outer leads and corresponding inner leads can be formed by the first layer of conductive material (conductive layer L1) on the first surface of the film substrate (the surface where the chip is located), and all wirings between the third row and the fourth row of outer leads and corresponding inner leads can be formed by the second layer of conductive material (conductive layer L2) on the second surface of the film substrate (the surface opposite to the surface where the chip is located). As mentioned earlier, the type (input type or output type) of each outer lead and each inner lead is designed according to the actual situation.

The design of the wirings on the conductive layer L1 is the same as that described above with reference to FIGS. 4A-4C, and the conductive layer L2 is used to form wirings between the third and fourth rows of outer leads and corresponding inner leads. In FIG. 8B, only two wirings are simply shown for each row in order to simplify the description. Although in FIG. 8B, it is taken as an example that the wirings between the third row of outer leads and the inner leads on the first side of the chip adopt a straight-pull connection mode and the wirings between the fourth row of outer leads and the inner leads on the second side of the chip adopt a closed-loop like connection mode, it should be understood that the connection mode of the wirings between the outer leads and the inner leads can also be adjusted according to the specific design of the type of the inner leads.

In addition, in FIG. 8B, the third and fourth rows of outer leads are arranged next to the first and second rows of outer leads, but it should be understood that the third and fourth rows of outer leads may be arranged between the first and second rows of outer leads, or the fourth row of outer leads may be arranged between the second and first rows of outer leads and the first row of outer leads may be arranged between the fourth and third rows of outer leads. Because the wirings between the third and fourth rows of outer leads and corresponding inner leads are formed on another conductive material layer, and pass through the film substrate 110 only in the regions of the third and fourth rows of outer leads and corresponding inner leads, to connect with the third and fourth rows of outer leads, so the related wirings of the first and second rows of outer leads will not be affected.

The structure of the COF package described with reference to FIGS. 4A-8B can use a single layer of conductive or two layers of conductive material to form wirings between two rows of outer leads or three or four rows of outer leads and corresponding inner leads, thus the number of output signals from the COF package can be increased, so that a smaller number of COF packages can be adopted and thickness of the COF package can be reduced, thereby cost can be reduced and size requirement can be met; further, wiring space can be fully utilized by setting part of the wirings as a closed-loop like mode, so that the spacing between the wirings or the spacing between the leads is not too small, and stability of signal transmission is improved; in addition, only one bonding process is required when the COF package is bonded with the backlight board or the display panel and the control circuit board in the display device, through which production efficiency can be improved accordingly.

According to another aspect of the present application, the COF package may be used in a display device to realize signal transmission between a control circuit board and a backlight board or a display panel.

A display device using the COF package described with reference to FIGS. 4A-8B will be described below.

The display device may be a liquid crystal display device (LCD) or an LED (including OLED) display device. In the case where the display device is an LCD display device, the backlight board includes a backlight circuit that needs to be driven with driving signals so as to emit light, for example, the backlight circuit may include light sources such as LEDs, i.e., LED backlight board. Therefore, the backlight board needs to be provided with backlight driving signals, and the backlight board may also need to obtain signals such as timing signals, clock signals, etc. In addition, a display circuit (e.g., including multiple pixel circuits) of a display panel (an LCD display panel or an LED display panel) also requires various signals such as gate driving signals or data signals for driving and control. The signals provided to the backlight board and/or the display panel may be obtained by: generating, by a basic control circuit, signals, and processing, by the chip, the signals provided by the control circuit. The printed circuit board on which the control circuit is arranged serves as the control circuit board.

Figure 9A:
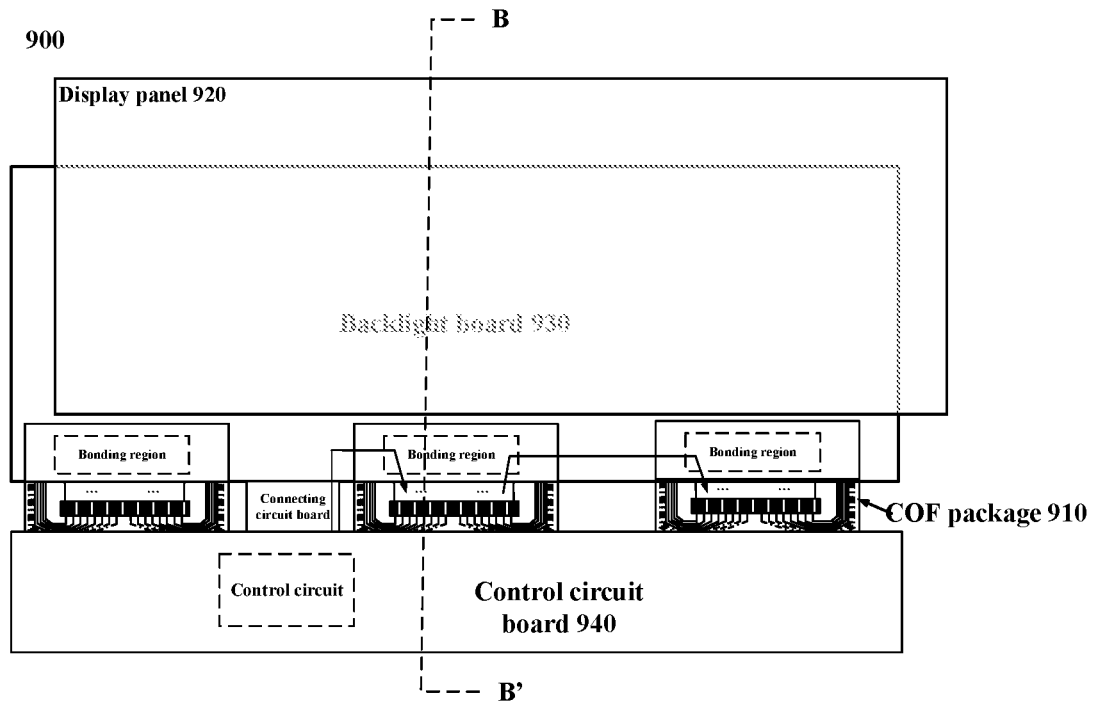
FIG. 9A shows a schematic planar structure view of a display device using the COF package described with reference to FIGS. 4A-8B.
Figure 9B:
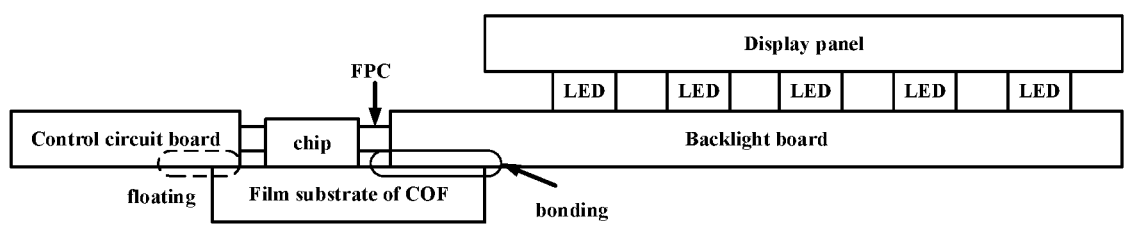
FIG. 9B shows a left view of the display device in FIG. 9A taken along the connection line B-B'.

FIGS. 9A-9B are schematic diagrams of a display device using the COF package described with reference to FIGS. 4A-8B.

FIG. 9A shows a schematic planar structure of a display device using the COF package described with reference to FIGS. 4A-8B.

As shown in FIG. 9A, the display device being an LCD display device is taken as an example for description. The display device 900 includes a COF package 910, a display panel 920, a backlight board 930 and a control circuit board 940.

The COF package 910 may have various structures of the COF package as previously described with reference to FIGS. 4A-8B.

The display panel 920 is used to display content to be displayed.

A backlight circuit is provided on the backlight board 930 to provide backlight for the display panel.

For example, a backlight circuit (e.g., a light-emitting circuit of a plurality of columns of LEDs) that includes a backlight light source on the backlight board 930 may cause the backlight light source to emit light based on backlight driving signals obtained from the COF package. A simple example of an LED backlight board is shown in FIGS. 9A-9B, but an actual LED backlight board is a complete backlight module, including a polarizer board and a diffuser board, etc.

A control circuit is provided on the control circuit board 940, for providing backlight control signals to the chip in the COF package and/or obtaining backlight related signals from the chip.

For example, the control circuit provided on the control circuit board can generate various control signals related to backlight driving and display process, and can also obtain signals from other circuits. For example, as for the backlight driving process, the control circuit can provide control signals such as timing signals and clock signals to the backlight board, and can provide backlight control signals to the driving chip (packaged on the COF package, and including one or more chip), and in addition, the control circuit can also obtain the backlight related signals (e.g., detection signals obtained by monitoring the backlight driving process, etc.) from the driving chip. In this way, the input outer leads in the COF package obtain the backlight control signals from the control circuit, and the output outer leads provide the backlight driving signals to the backlight circuit on the backlight board and/or provides the backlight related signals to the control circuit on the control circuit board.

Optionally, since the input outer leads and the output outer leads arranged in at least two rows in the COF package are located on the same side of the chip region, the bonding process is required only once, thus one of the control circuit board and the backlight board can be bonded to the COF package.

When the control circuit board is not bonded with the COF package, as shown in FIG. 9A, the backlight board can be used to forward the backlight control signals that the control circuit on the control circuit board needs to transmit to the chip on the COF package, and corresponding transmission paths are arranged on the backlight board.

A bonding region is provided on the backlight board 930, the input outer leads and the output outer leads of the COF package 910 are attached (bonded) to the bonding region, and the backlight control signals from the control circuit board are transmitted to the bonding region of the backlight board, the backlight control signals are provided to the input outer leads of the COF package via the bonding region, and the backlight driving signals generated by the chip are provided to the backlight circuit on the backlight board via the output outer leads of the COF package. For example, the output outer leads of the COF package are connected to the driving lines on the backlight board. For example, a driving line can be connected to a column of LEDs. For example, if one COF package includes 400 output outer leads, the 400 output outer leads can provide the drive current to drive 400 columns of LEDs when connected to 400 driving lines on the backlight board.

Optionally, as shown in FIG. 9A, the control circuit board can transmit, by a connecting circuit board, to the backlight board, the signals that the control circuit on the control circuit board needs to transmit directly to the backlight board together with the backlight control signals that need to be transmitted to the driving chip on the COF package, and then at least part of these signals from the control circuit are transmitted to corresponding bonding pads in the bonding region of the backlight board through the wirings on the backlight board. In this way, when the COF package is bonded to the bonding region of the backlight board, the COF package can obtain the backlight control signals to be provided to the driving chip at the input outer leads of the COF package, as the input signals of the COF package. After the processing of the driving chip on the COF package, the backlight driving signals are provided to the backlight circuit of the backlight board from the output outer leads via corresponding bonding pads in the bonding region of the backlight board.

Optionally, the connecting circuit board may be a flexible circuit board, and the specific implementation may include, for example, PCB/FPC/BT/ABF and so on.

In this case, the film substrate 910 of the COF package may not have outer leads that are electrically connected to the control circuit board for input/output purposes, and the side of the COF package close to the control circuit board can be regarded as floating connection with the control circuit board, and other methods may be adopted to fix the film substrate (for example, by using adhesive to stick the film substrate or by using other components to fix the film substrate) so that the film substrate will not deform.

In addition, since the number of backlight driving signals used to drive the backlight circuit on the backlight board is usually relatively large, multiple driving chips are required to generate these backlight driving signals, so multiple COF packages can be adopted. Various signals may be transmitted between adjacent COF packages among these multiple COF packages. For example, connection wirings may be arranged between bonding pads in adjacent bonding regions of the backlight board, the control circuit on the control circuit board may provide the backlight control signals to a certain COF package as input signals via the connecting circuit board such as FPC, corresponding connection wirings on the backlight board, and corresponding bonding pads in the bonding region of the backlight board to which the COF package is bonded, and the COF package can provide, via part of the outer leads and corresponding connection wirings on the backlight board, backlight control signals to the input outer leads of one adjacent COF package. Optionally, the COF package may not process some input signals (e.g., backlight control signals) inputted from the input outer leads, and transmit these input signals to one adjacent COF package; or, a part of the input signals of the driving chip of a next COF package may be part of the output signals processed by the driving chip of its previous COF package, and the present application makes not limitation to the types of signals transmitted between the COF packages.

FIG. 9B shows a left view of the display device in FIG. 9A taken along the connection line B-B'.

As shown in FIG. 9B, the film substrate of the COF package is located lowermost, and the control circuit board and the backlight board are located above it. The side of the COF package close to the control circuit board can be regarded as floating connection with the control circuit board, or other modes (for example, by adhesive or by other mechanical components) may be adopted to fix the film substrate so that the film substrate will deform. The side of the COF package close to the backlight board is bonded to the backlight board at the bonding region. Although the chip is located between the control circuit board and the backlight board in the left view taken along the connection line B-B' in FIG. 9B, it should be understood that the chip is not directly connected to the control circuit board or the flexible circuit board FPC, and the control circuit board is connected to the backlight board via FPC, to transmit the signals to be provided to the chip.

With the display device shown in FIGS. 9A-9B, since the outer leads of each included COF packages can be arranged in at least two rows, the number of leads is increased, and the size is relatively small, thus a relatively small number of COF packages can be used, so that the size of the display device can be reduced and the cost can be reduced; in addition, the bonding process is required to be performed once when the signal transmission is to be performed between the COF package and the backlight board and the control circuit board, so that the production efficiency can be improved.

Figure 10A:
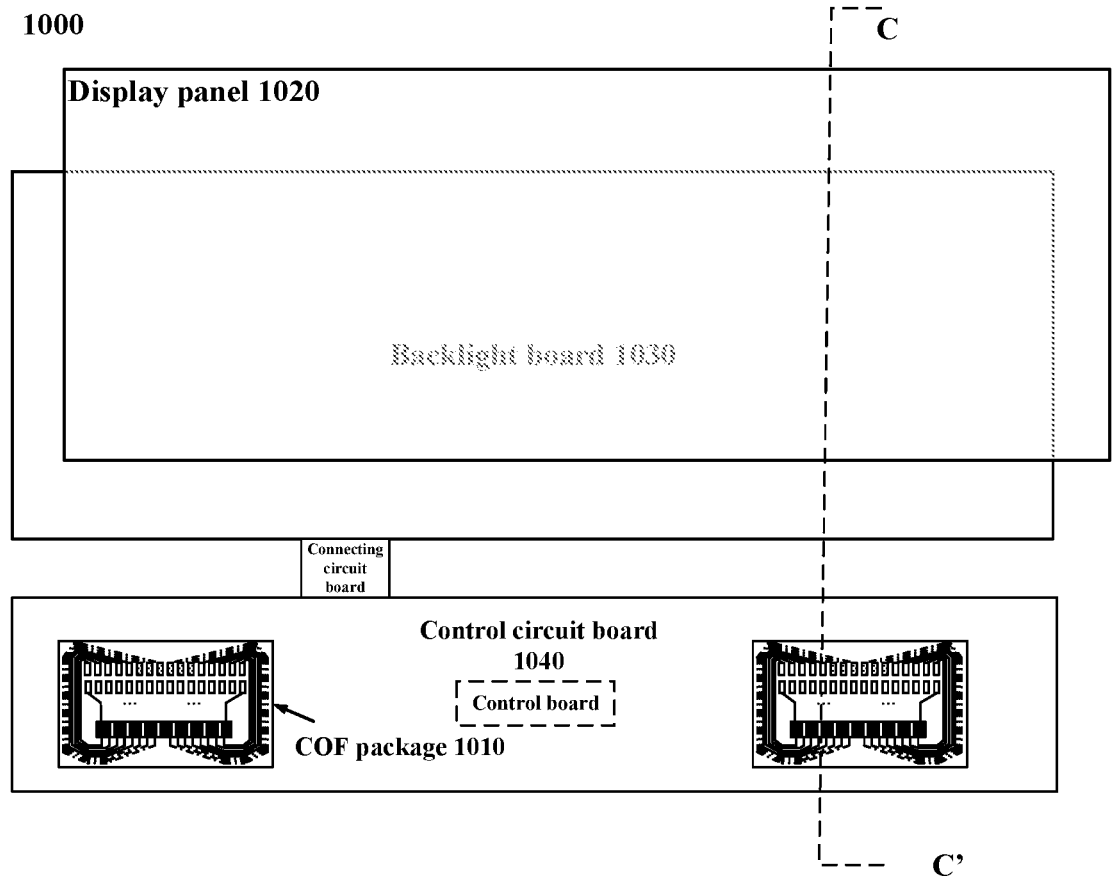
FIG. 10A shows a schematic planar view of another display device using the COF package described with reference to FIGS. 4A-8B.
Figure 10B:
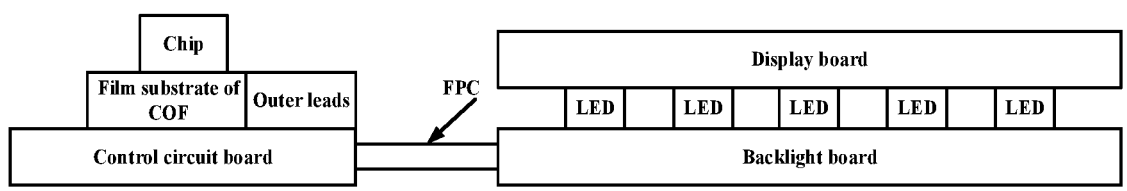
FIG. 10B shows a left view of the display device in FIG. 10A taken along the connection line C-C'.

FIGS. 10A-10B show schematic diagrams of another display device using the COF package described with reference to FIGS. 4A-8B, wherein FIG. 10A shows a schematic planar view of the another display device, and FIG. 10B shows a left view taken along the connection line C-C'.

For the sake of brevity, the components of the display device 1000 of FIGS. 10A-10B similar to those of the display device 900 of FIG. 9A will not be described repeatedly, and only the differences between them will be described.

As shown in FIGS. 10A-10B, unlike the display device in FIG. 9A, the COF package in FIGS. 10A-10B is bonded to the control circuit board.

The control circuit board 1040 is provided thereon with a bonding region on which the input outer leads and the output outer leads of the COF package 1010 are attached (bonded). The control circuit on the control circuit board provides the backlight control signals to the input outer leads of the COF package via the bonding region, and the backlight driving signals from the output outer leads of the COF package 1010 are provided to the backlight board on the backlight circuit via the bonding region. Here, the backlight driving signals are generated by the driving chip in the COF package 1010 based on the backlight control signals.

For example, the bonding pads in the bonding region on the control circuit board obtain the backlight driving signals generated by the driving chip based on the backlight control signal from the output outer leads of the COF package 1010, thereafter the backlight driving signals are transmitted, via the bonding pads in the bonding region on the control circuit board, wirings on the control circuit board and the connecting circuit board between the control circuit board and the backlight board, to the backlight circuit of the backlight board.

That is, the backlight driving signals (and other control signals such as timing signals and clock signals) required by the backlight board are transmitted from the control circuit board through the connecting circuit board.

Figure 11:
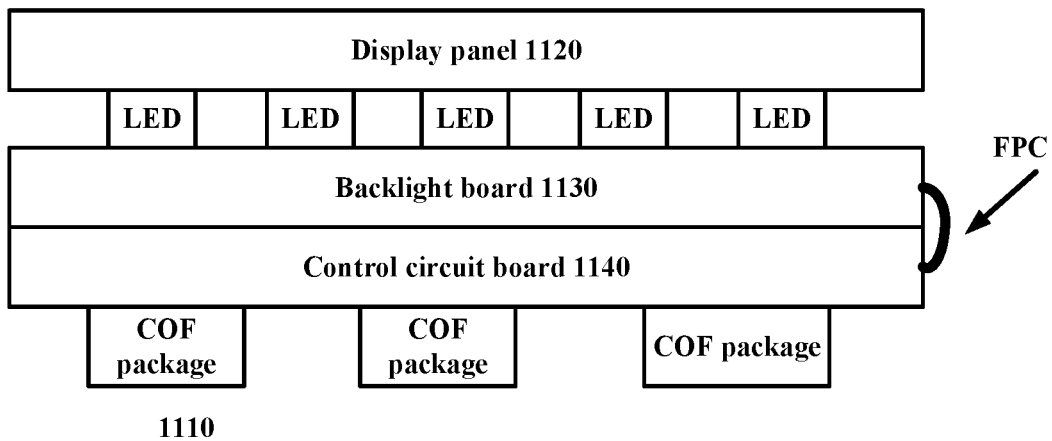
FIG. 11 shows a schematic cross-sectional view of another display device using the COF package described with reference to FIGS. 4A-8B.

Furthermore, as an alternative to the display device in FIGS. 10A-10B, FIG. 11 shows a schematic cross-sectional view of another display device.

For the sake of brevity, the components of the display device of FIG. 11 similar to those of the display device of FIGS. 9A and 10A-10B will not be repeatedly described, and only the differences between them will be described.

As shown in FIG. 11, the COF package is bonded to the control circuit board, and unlike in FIGS. 10A-10B, the control circuit board 1140 is vertically disposed under the backlight board 1130, the lower surface (the surface on which the COF package is arranged is the upper surface of the control circuit board) of the control circuit board 1140 is in contact with the lower surface of the backlight board 1130 (the lower surface of the substrate), the upper surface of the control circuit board 1140 is provided thereon with a bonding region, and the input outer leads and the output outer leads of the COF package 1110 are attached (bonded) to the bonding region.

The control circuit on the control circuit board 1140 provides, via the bonding region, to the input outer leads of the COF package, the backlight control signals, and the backlight driving signals generated by the chip based on the backlight control signals and from the output outer leads of the COF package are provided, via the bonding region, to the backlight circuit on the backlight board 1130.

For example, the bonding pads in the bonding region on the control circuit obtain the backlight driving signals from the output outer leads of the COF package 1010, thereafter the backlight driving signals are transmitted, via the bonding pads in the bonding region on the control circuit board, the wirings on the control circuit board and the connecting circuit board between the control circuit board and the backlight board, to the backlight circuit on the backlight board.

That is, the backlight driving signals (and other control signals such as timing signals and clock signals) required by the backlight board are transmitted from the control circuit board through the connecting circuit board.

Likewise, with the display device shown in FIGS. 10A-10B and 11, similar to the display device in FIG. 9A, the size of the display device can also be reduced, and the production efficiency can be improved.

The case where the output outer leads of the COF package output the backlight driving signals used for driving the backlight circuit on the backlight board in the display device has been described above with reference to FIGS. 9A-11, in addition, this COF package can also be used to output the display driving signals for driving the display circuit on the display panel in the display device. In this case, the connection manner of the COF package with the display panel and the control circuit board is similar to the connection manner of the COF package with the backlight board and the control circuit board described with reference to FIGS. 9A-11.

Figure 12:
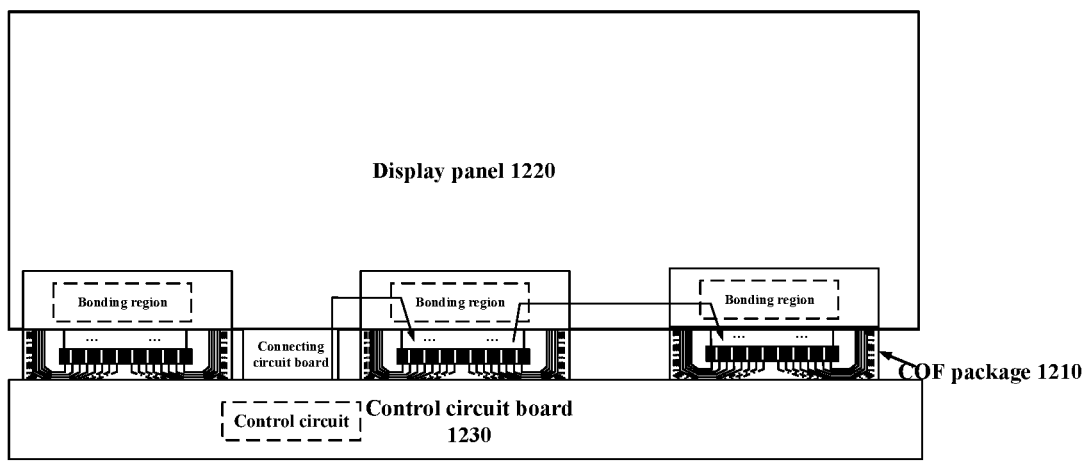
FIG. 12 shows a schematic planar view of another display device using the COF package described with reference to FIGS. 4A-8B.

For example, FIG. 12 shows a schematic planar view of another display device using the COF package described with reference to FIGS. 4A-8B.

As shown in FIG. 12, the display device 1200 includes a COF package 1210, a display panel 1220, and a control circuit board 1230.

The COF package 1210 may have various structures of the COF package as described above with reference to FIGS. 4A-8B, and a display circuit is provided on the display panel 1220 for displaying contents to be displayed. Optionally, the display circuit needs to acquire display related signals such as gate driving signals and data signals.

The control circuit board 1230 is provided thereon with a control circuit for providing display control signals (e.g., data signals, clock signals, etc.) to the display circuit, and providing display driving control signals (e.g., gate driving signals, etc.) to the chip on the COF package or obtain driving related signals from the chip.

For example, the control circuit provided on the control circuit board can generate various control signals related to the display process and the display driving process, and can also obtain signals from other circuits. For example, the control circuit may provide display driving control signals to the driving chip (packaged on the COF package, one or more chips), and may also optionally obtain display driving related signals from the display driving chip (e.g., detection signals obtained by monitoring the display driving process). In this way, the input outer leads in the COF package can obtain the display driving control signals from the control circuit, and the output outer leads provide the display driving signals to the display circuit on the display panel and/or provide the control circuit with the display driving related signals.

Optionally, since the input outer leads and the output outer leads arranged in at least two rows in the COF package are located on the same side of the chip region, bonding process is required to be performed only once, thus one of the control circuit board and the backlight board can be bonded with the COF package.

As shown in FIG. 12, when the control circuit board is not bonded with the COF package, the display panel can be used to forward the display driving control signals that the control circuit on the control circuit board needs to transmit to the display driving chip on the COF package, and corresponding transmission paths are arranged on the display panel.

A bonding region is provided on the display panel 1230, the input outer leads and the output outer leads of the COF package 1210 are attached (bonded) to the bonding region, and the display driving control signals from the control circuit board are transmitted to the bonding region of the display panel, the display driving control signals are provided to the input output leads of the COF package via the bonding region, and the display driving signals generated by the chip are provided to the display circuit on the display panel via the output outer leads of the COF package.

Optionally, as shown in FIG. 12, the control circuit board can transmit, via the connecting circuit board, to the display panel, the display driving control signals that needs to be transmitted to the driving chip on the COF package, and the display driving control signals are transmitted to corresponding bonding pads in the bonding region of the display panel through the wirings (not shown) on the display panel. In this way, when the COF package is bonded to the bonding region of the display panel, the COF package can obtain the display driving control signals to be provided to the driving chip at the input outer leads of the COF package, as the input signals of the display driving chip on the COF package. After the processing of the driving chip on the COF package, the generated display driving signals are provided to the display circuit on the display panel from the output outer leads via corresponding bonding pads in the bonding region of the display panel.

Optionally, the connecting circuit board may be a flexible circuit board, and the specific implementation may be, for example, PCB/FPC/BT/ABF and so on.

In this case, the film substrate 1210 of the COF package may not have outer leads that are electrically connected to the control circuit board for input/output purposes, and the side of the COF package close to the control circuit board can be regarded as floating connection with the control circuit board, and other modes (for example, by adhesive or by other mechanical components) may be adopted to fix the film substrate so that the film substrate will not deform.

In addition, since the number of display driving signals used to drive the display circuit on the display panel is usually relatively large, multiple driving chips are required to generate these display driving signals, so multiple COF packages can be adopted. For example, various signals may be transmitted between adjacent COF packages among the multiple COF packages. For example, connection wirings may be arranged between bonding pads in adjacent bonding regions of the display panel, and the control circuit on the control circuit board may provide signals to a certain COF package as input signals, via the connecting circuit board such as FPC, corresponding connection wirings on the display panel, and corresponding bonding pads in the bonding region of the display panel to which the COF package is bonded. Optionally, the COF package may not process some input signals (e.g., display control signals) inputted from the input outer leads, and transmit these input signals to one adjacent COF package; or, part of the input signals of the driving chip of a next COF package may be part of the output signals processed by the driving chip of its previous COF package, and the present application makes not limitation to the types of signals transmitted between the COF packages. For example, when the COF package includes gate driving circuits GOA, a previous stage of COF package can provide a start signal for the first GOA circuit in its next stage of COF package and/or provide a clock signal or the like common to all GOA circuits.

Similarly, instead of bonding the COF package to the bonding region of the display panel as described in FIG. 12, the COF package can also be bonded with the control circuit board, which is similar to the arrangement described above with reference to FIGS. 10A-10B and FIG. 11, only the backlight board is replaced with the display panel.

For example, in the first example in which the COF package can be bonded with the control circuit board, the control circuit board is provided thereon with a bonding region, the input outer leads and the output outer leads of the COF package are attached (bonded) to the bonding region, and the control circuit provides, via the bonding region, to the input outer leads of the COF package, the display driving control signals, and the display driving signals generated by the chip based on the display driving control signals and from the output outer leads of the COF package are provided, via the bonding region, to the display circuit on the display panel.

For example, in the second example in which the COF package can be bonded with the control circuit board, the control circuit board is vertically disposed below the display panel, the lower surface of the control circuit board is in contact with the lower surface of the display panel, and the upper surface of the control circuit board is provided with a bonding region, the input outer leads and the output outer leads of the COF package are attached(bonded) to the bonding region, the control circuit provides, via the bonding region, to the input outer leads of the COF package, the display driving control signals, and the display driving signals generated by the chip based on the display control signals and from the output outer leads of the COF package are provided, via the bonding region, to the display circuit on the display panel.

Similarly, with the display device shown in FIG. 12, since the outer leads of each included COF package can be arranged in at least two rows, the number of leads is increased, and the size is relatively small, thus a relatively small number of COF packages can be used, so that the size of the display device can be reduced and the cost can be reduced; in addition, bonding process is required to be performed only once when the signal transmission is to be performed between the COF package and the display panel and the control circuit board, so that the production efficiency can be improved.

Although the COF package and their bonding manners are respectively described for the backlight board and the display panel in the display device described above with reference to FIGS. 9A-12, it should be understood that since both the backlight board and the display panel are included in the LCD display device, the COF package according to the embodiments of the present application may be adopted for both the backlight board and the display panel.

Although the present application has been disclosed above with embodiments, it is not intended to limit the present application. Those of ordinary skill in the art can make some changes and modifications without departing from the spirit and scope of the present application. Therefore, the protection scope of the present application should be determined by the appended claims.

What is claimed is:

1. A Chip on Film package, comprising:
   a film substrate;
   a chip arranged within a chip region on the film substrate;
   outer leads arranged on a same side of the chip region on the film substrate, the outer leads being arranged as at least two rows of outer leads and including input outer leads and output outer leads;
   inner leads arranged on a first side and a second side of the chip and connected with the chip, the first side of the chip being a side facing the outer leads, and the inner leads including input inner leads and output inner leads;
   wherein the output inner leads are connected with the output outer leads, for providing signals outputted by the chip to the output outer leads; and the input inner leads are connected with the input outer leads, for providing signals from the input outer leads to the chip,
   wherein the at least two rows of outer leads include a first row of outer leads and a second row of outer leads, the first row of outer leads are between the second row of outer leads and the chip, and wirings between at least a part of outer leads among the second row of outer leads and the inner leads on the second side of the chip adopt a closed-loop like connection mode.

2. The Chip on Film package according to claim 1, wherein the at least two rows of outer leads are arranged within an outer lead region of the film substrate,
   wherein the outer lead region is at a predetermined distance from an edge of the film substrate, and a region defined by the predetermined distance is used to arrange wirings adopting the closed-loop like connection mode.

3. The Chip on Film package according to claim 1, wherein
   wirings between the inner leads on the first side of the chip and the first row of outer leads of the two rows of outer leads adopt a straight-pull connection mode; and
   wirings between the inner leads on the second side of the chip and the second row of outer leads of the two rows of outer leads adopt a closed-loop like connection mode.

4. The Chip on Film package according to claim 1, wherein the output inner leads are arranged on two sides of the chip,
   wirings between the output inner leads arranged on the first side of the chip among the output inner leads and their corresponding output outer leads adopt a straight-pull connection mode, and wirings between the output inner leads arranged on the second side of the chip and their corresponding output outer leads adopt a closed-loop like connection mode.

5. The Chip on Film package according to claim 1, wherein the output inner leads are all arranged on the first side of the chip or all arranged on the second side of the chip,
   in the case where the output inner leads are all arranged on the first side of the chip, wirings between the output inner leads and their corresponding output outer leads adopt a straight-pull connection mode, and
   in the case where the output inner leads are all arranged on the second side of the chip, wirings between the output inner leads and their corresponding output outer leads adopt a closed-loop like connection mode.

6. The Chip on Film package according to claim 1, wherein the input inner leads are arranged on two sides of the chip,
   wirings between the input inner leads arranged on the first side of the chip among the input inner leads and their corresponding input outer leads adopt a straight-pull connection mode, and wirings between the input inner leads arranged on the second side of the chip and their corresponding input outer leads adopt a closed-loop like connection mode.

7. The Chip on Film package according to claim 1, wherein the input inner leads are all arranged on the first side of the chip or all arranged on the second side of the chip,
   in the case where the input inner leads are all arranged on the first side of the chip, wirings between the input inner leads and their corresponding input outer leads adopt a straight-pull connection mode, and
   in the case where the input inner leads are all arranged on the second side of the chip, wiring between the input inner leads and their corresponding input outer leads adopt a closed-loop like connection mode.

8. The Chip on Film package according to claim 1, wherein the at least two rows of outer leads are in an alignment arrangement or in an alternate arrangement.

9. The Chip on Film package according to claim 1, wherein all wirings between the input outer leads and the input inner leads as well as all wirings between the output inner leads and the output outer leads are formed by a single layer of conductor on the film substrate.

10. The Chip on Film package according to claim 1, wherein the input outer leads and the output outer leads are arranged as three rows of outer leads or four rows of outer leads.

11. The Chip on Film package according to claim 10, wherein all wirings between the input outer leads and the input inner leads as well as all wirings between the output inner leads and the output outer leads are formed by two layers of conductor which are mutually isolated and formed respectively on two opposite surfaces of the film substrate.

12. The Chip on Film package according to claim 1, wherein the Chip on Film package implements inputting of signals to the chip and outputting of signals from the chip via only one bonding process with an external circuit board at the outer leads.

13. A display device, comprising:
    the Chip on Film package according to claim 1;
    a display panel used to display contents to be displayed;
    a backlight board on which a backlight circuit is arranged, for providing backlight for the display panel;
    a control circuit board on which a control circuit is arranged, for providing backlight control signals to the chip in the Chip on Film package and/or obtain backlight related signals from the chip,
    wherein input outer leads in the Chip on Film package obtain the backlight control signals from the control circuit, and output outer leads provide backlight driving signals to the backlight circuit and/or provide backlight related signals to the control circuit, the backlight driving signals are generated by the chip based on the backlight control signals.

14. The display device according to claim 13, further comprising:
    a connecting circuit board that connects the control circuit board with the backlight board, and used for signal transmission between the control circuit board and the backlight board.

15. The display device according to claim 13, wherein a bonding region is provided on the backlight board, and input outer leads and output outer leads of the Chip on Film package are attached to the bonding region, backlight control signals from the control circuit board are transmitted to the bonding region of the backlight board, the backlight control signals are provided to input outer leads of the Chip on Film package via the bonding region, and the backlight driving signals generated by the chip are provided to the backlight circuit on the backlight board via output outer leads of the Chip on Film package.

16. The display device according to claim 13, wherein a bonding region is provided on the control circuit board, and input outer leads and output outer leads of the Chip on Film package are attached to the bonding region, the control circuit provides the backlight control signals to input outer leads of the Chip on Film package via the bonding region, backlight driving signals from output outer leads of the Chip on Film package and generated by the chip based on the backlight control signals are provided to the backlight circuit on the backlight board via the bonding region.

17. The display device according to claim 13, wherein the control circuit board is vertically arranged below the backlight board, and a lower surface of the control circuit board is in contact with a lower surface of the backlight board, a bonding region is provided on an upper surface of the control circuit board, and input outer leads and output outer leads of the Chip on Film package are attached to the bonding region, the control circuit provides the backlight control signals to input outer leads of the Chip on Film package via the bonding region, the backlight driving signals from output outer leads of the Chip on Film package and generated by the chip based on the backlight control signal are provided to the backlight circuit on the backlight board via the bonding region.

18. A display device, comprising:
the Chip on Film package according to claim 1;
a display panel on which a display circuit is arranged;
a control circuit board on which a control circuit is arranged, for providing display control signals to the display circuit, and providing display driving control signals to the chip in the Chip on Film package and/or to obtain display related signals from the chip,
wherein input outer leads in the Chip on Film package obtain the display driving control signals from the control circuit, and output outer leads provide display driving signals to the display circuit and/or provide the display related signals to the control circuit, the display driving signals are generated by the chip based on the display driving control signals.

19. The display device according to claim 18, further comprising:
a connecting circuit board connecting the control circuit board with the display panel, and used for signal transmission between the control circuit board and the display panel.

20. The display device according to claim 18, wherein a bonding region is provided on the display panel, and input outer leads and output outer leads of the Chip on Film package are attached to the bonding region, display driving control signals from the control circuit board are transmitted to the bonding region of the display panel, the display driving control signals are provided to input outer leads of the Chip on Film package via the bonding region, and the display driving signals generated by the chip based on the display driving control signal are provided to the display circuit on the display panel via the output outer leads of the Chip on Film package.

21. The display device according to claim 18, wherein a bonding region is provided on the control circuit board, and input outer leads and output outer leads of the Chip on Film package are attached to the bonding region, the control circuit provides display driving control signals to the input outer leads of the Chip on Film package via the bonding region, display driving signals from the output outer leads of the Chip on Film package and generated by the chip based on the display driving control signals are provided to a display circuit on the display panel via the bonding region.

22. The display device according to claim 18, wherein the control circuit board is vertically arranged below the display panel, and a lower surface of the control circuit board is in contact with a lower surface of the display panel, a bonding region is provided on an upper surface of the control circuit board, and input outer leads and output outer leads of the Chip on Film package are attached to the bonding region, the control circuit provides display driving control signals to input outer leads of the Chip on Film package via the bonding region, display driving signals from output outer leads of the Chip on Film package and generated by the chip based on the display driving control signals are provided to a display circuit on the display panel via the bonding region.

* * * * *